United States Patent
Pullini et al.

(10) Patent No.: US 7,615,995 B2
(45) Date of Patent: *Nov. 10, 2009

(54) THIN FILM DEVICE FOR DETECTION OF PHYSICAL QUANTITIES

(75) Inventors: Daniele Pullini, Orbassano (IT); Gianfranco Innocenti, Rivalta (IT); Piermario Repetto, Turin (IT); Antonio Ruotolo, Orbassano (IT)

(73) Assignee: C.R.F. Società Consortile per Azioni, Orbassano (Turin) (IT)

( * ) Notice: Subject to any disclaimer, the term of this patent is extended or adjusted under 35 U.S.C. 154(b) by 349 days.

This patent is subject to a terminal disclaimer.

(21) Appl. No.: 11/512,217

(22) Filed: Aug. 30, 2006

(65) Prior Publication Data

US 2007/0091510 A1 Apr. 26, 2007

(30) Foreign Application Priority Data

Oct. 26, 2005 (IT) .......................... TO2005A0758

(51) Int. Cl.
*G01R 33/02* (2006.01)

(52) U.S. Cl. .................. 324/252; 324/249; 977/960

(58) Field of Classification Search ................ 324/252, 324/207.2, 249, 260, 338–341; 977/700–701, 977/810, 838, 953, 960; 702/5–13
See application file for complete search history.

(56) References Cited

U.S. PATENT DOCUMENTS 3,813,660 A 5/1974 Buhrer
3,838,406 A 9/1974 Cohen et al.
4,159,537 A 6/1979 Schwartz
5,552,706 A 9/1996 Carr
5,936,402 A * 8/1999 Schep et al. ................ 324/252
7,093,347 B2 * 8/2006 Nowak et al. ............ 29/603.07

FOREIGN PATENT DOCUMENTS

EP 0 675 371 10/1995

OTHER PUBLICATIONS

J. M. D. Coey, Non-volatile magnetoresistive structure for use in computer, has nanoconstrictions or nanocontacts of similar or different dimensions provided between films; IE 82101 B3; Feb. 6, 2002, pp. 1-4.*

* cited by examiner

*Primary Examiner*—Jay M Patidar
(74) *Attorney, Agent, or Firm*—Nixon & Vanderhye P.C.

(57) ABSTRACT

A thin-film device for detecting the variation of intensity of physical quantities, in particular a magnetic field, in a continuous way, comprises an electrical circuit including one or more sensitive elements, which are designed to vary their own electrical resistance as a function of the intensity of a physical quantity to be detected. One or more of the sensitive elements comprise at least one nanoconstriction, and the nanoconstriction comprises at least two pads made of magnetic material, associated to which are respective magnetizations oriented in directions substantially opposite to one another and connected through a nanochannel. The nanochannel is able to set up a domain wall that determines the electrical resistance of the nanoconstriction as a function of the position, with respect to the nanochannel, of the domain wall formed in the sensor device. At least one cross section of the nanochannel is configured so as to present a variable extension along one or more axes as a function of different values of the physical quantity to be detected.

39 Claims, 9 Drawing Sheets

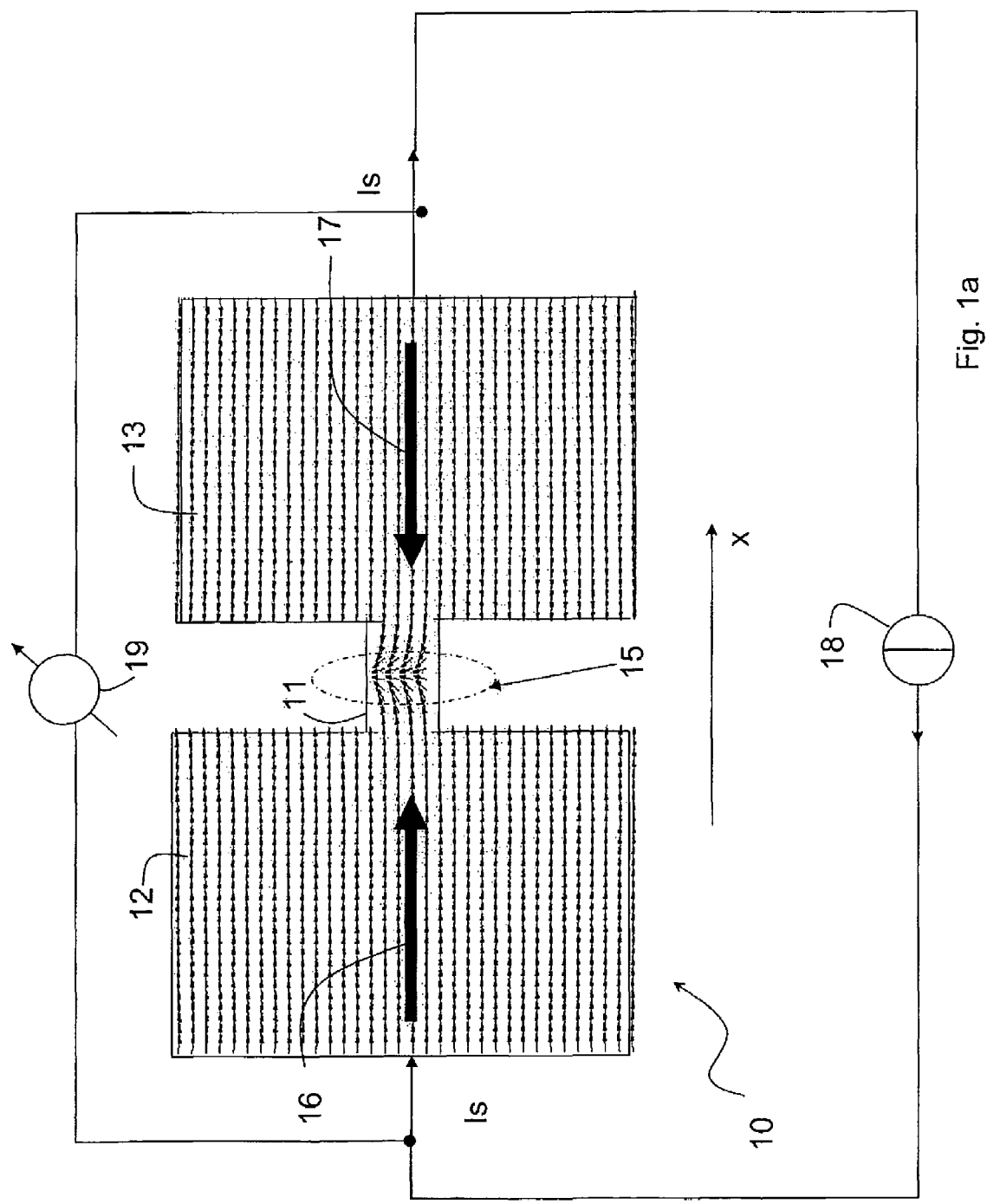

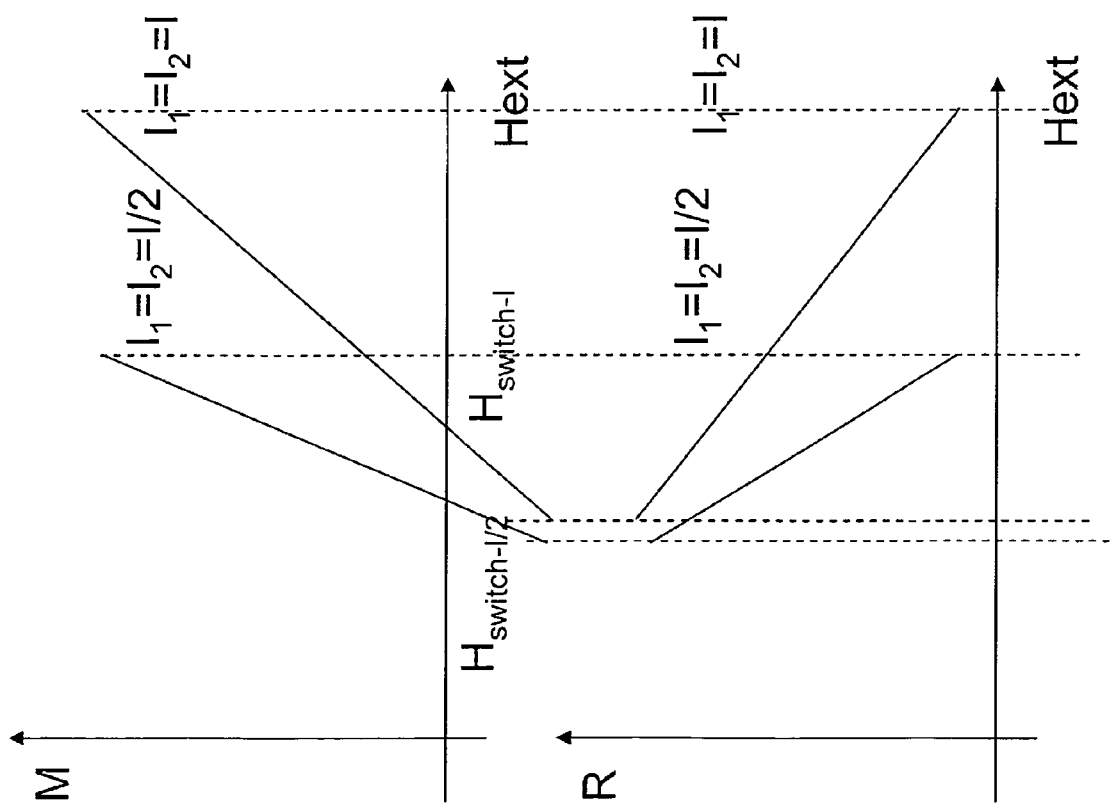

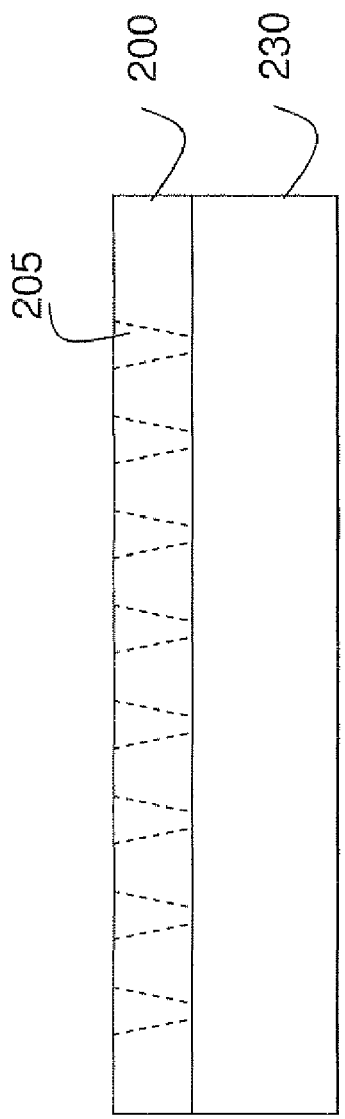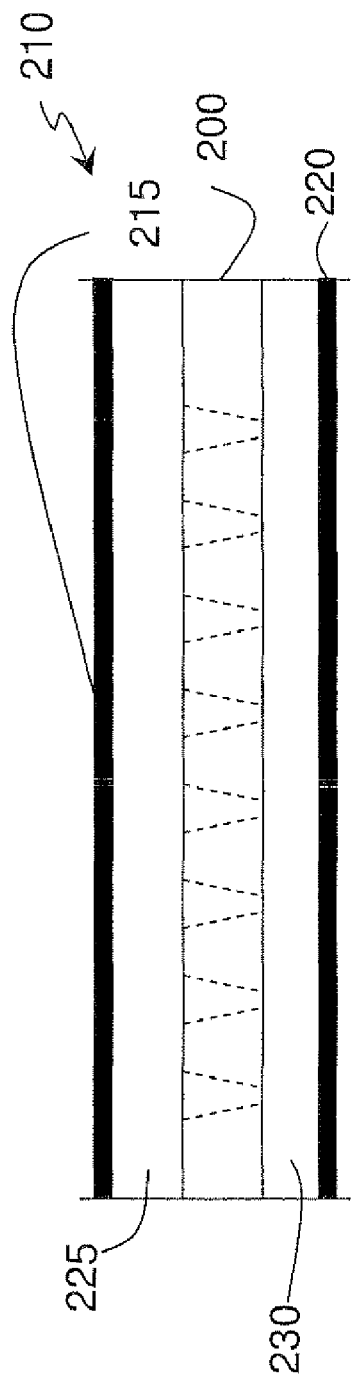
Fig 8a
Fig 8b

THIN FILM DEVICE FOR DETECTION OF PHYSICAL QUANTITIES

The present invention relates to a thin-film device for detection of physical quantities, in particular for detecting a magnetic field, of the type comprising an electrical circuit including one or more sensitive elements, said device being designed to vary its own electrical resistance as a function of a physical quantity to be detected, said one or more sensitive elements comprising at least one nanoconstriction, said nanoconstriction comprising at least two pads made of magnetic material, in particular ferromagnetic material, associated to which are respective magnetizations oriented in directions substantially opposite to one another and connected through a nanochannel, said nanochannel being able to set up a domain wall that determines the electrical resistance of said nanoconstriction as a function of the position, with respect to said nanochannel, of said domain wall that is formed in said sensor device.

The presence of magnetic domain walls (DWs) in metal ferromagnetic materials is well known, as likewise is the influence of said walls on the resistance of said materials. The recent progress made in the field of nanotechnologies have enabled measurement of the contribution to the resistance determined by an individual domain wall, identifying cases in which the DW resistance is negative and other cases in which the DW resistance is positive. Studies on nickel break junctions have shown onset of a magnetoresistance of a large amount, attributed to the presence of a magnetic wall in a confined space, in particular a nanochannel; see, for example, J. D. Burton et al. Applied Physics Letters, 85, 2, (2004).

Said structures can be produced with techniques of electron-beam lithography or with focused ion beam having a size of around 10 nm.

In particular, here, as has been said, reference is made to the electrical resistance determined by a domain wall confined in a nanochannel, i.e., in an electrical path, made of magnetic material, that is very thin and has a cross section of nanometric dimensions.

In what follows, the term "nanoconstriction" is, instead, used to indicate the structure comprising said nanochannel substantially in the form of constriction of nanometric dimensions between pads having wider sections or dimensions, i.e., for example, a structure consisting of two magnetic electrodes connected by a magnetic wire of nanometric length and with a cross section of just a few nanometres. It is known in fact that in a nanoconstriction made through anisotropic magnetic materials such as cobalt, iron, nickel and α-metal such as LSMO (Lanthanum and Strontium Manganate) it is possible to trap a domain wall, this resulting in a reduced conductance of the nanoconstriction itself, a fact that determines a positive DW resistance.

BRIEF DESCRIPTION OF THE DRAWINGS

The invention will now be described with reference to the accompanying drawings, which are provided by way of non-limiting examples and in which:

FIG. 1a represents a nanoconstriction-structure device as an embodiment of the invention.

FIGS. 6c, 6d and 6e represent diagrams illustrating conditions of operation of the variant of an embodiment of the magnetic-field sensor device according to the invention.

FIGS. 7a, 7b and 7c represent three possible variants of the nanochannel used in an embodiment of FIG. 5a.

FIGS. 8a and 8b represent further variants of the nanochannel used in an embodiment of FIG. 5a.

DETAILED DESCRIPTION

Figure 1B:
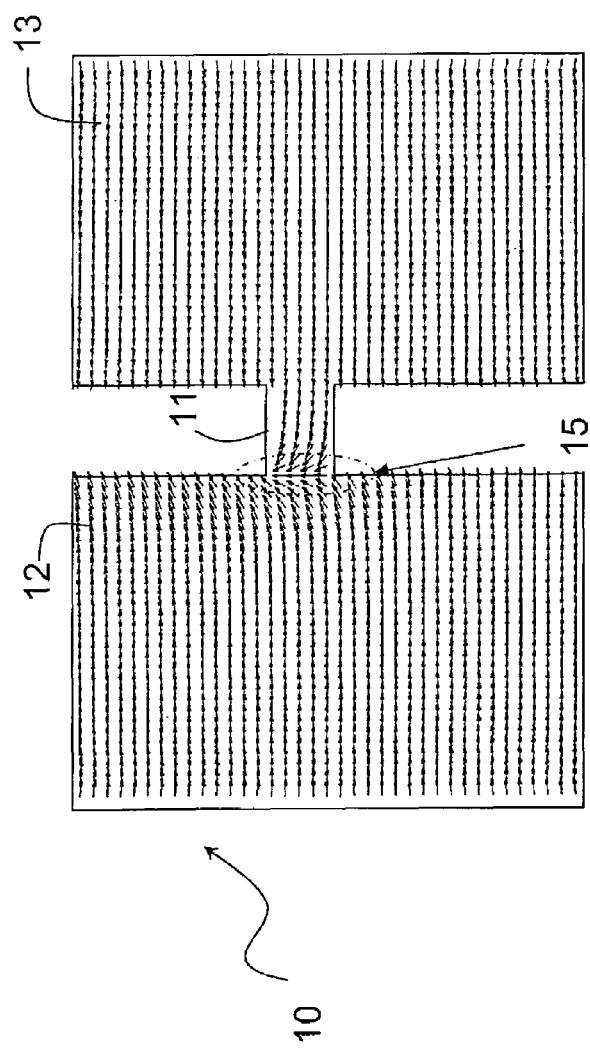
FIG. 1b illustrates a position of a magnetic domain wall 15 under the action of an external field oriented in the direction x.

FIG. 1a represents a nanoconstriction-structure device designated as a whole by the reference number 10, which comprises a first ferromagnetic pad 12 and a second ferromagnetic pad 13 joined by a nanochannel 11. Highlighted in the nanochannel 11 is the presence of a magnetic domain wall 15 positioned at the centre of the nanochannel. FIG. 1b illustrates the position of the magnetic domain wall 15 under the action of an external field oriented in the direction x. In general, the position of the wall 15 within the nanochannel 11 is a function of the intensity and direction of the external magnetic field. The magnetic wall 15, nucleated in the nanochannel 11, moves in the direction of the external magnetic field.

The device 10 has a resistance that can be measured, for example, by forcing a measurement current Is via a current generator 18 and measuring the voltage drop determined by the device 10 using a voltmeter 19.

As has been said above, a resistance, referred to also as DW resistance, may be ascribed to the magnetic domain wall 15. This resistance is due, in the first place, to the phenomenon of electron scattering, or diffusion, which takes place to a larger extent when an electron that has the spin oriented in a certain direction passes through a material magnetized in a direction different from that of the spin. In a domain wall, the local magnetization changes direction, so that the domain wall 15 represented in FIG. 1a precisely constitutes the area of junction between two parts of material magnetized in different directions. Electron scattering is a function of the magnetization gradient, i.e., of how rapidly the magnetization varies along the line of path of the electrons. If the magnetization gradient is high, the local magnetization varies rapidly, and hence the thickness of the magnetic domain wall is small. As has been demonstrated in the past, the resistance of a wall depends upon the inverse of its thickness. The thinner a wall, the higher its electrical resistance; in this connection, see, for example, the paper published by G. G. Cabrera and L. M. Falicov, 1974, in Phys. Status Solidi (b) 61, 59.

Figure 1C:
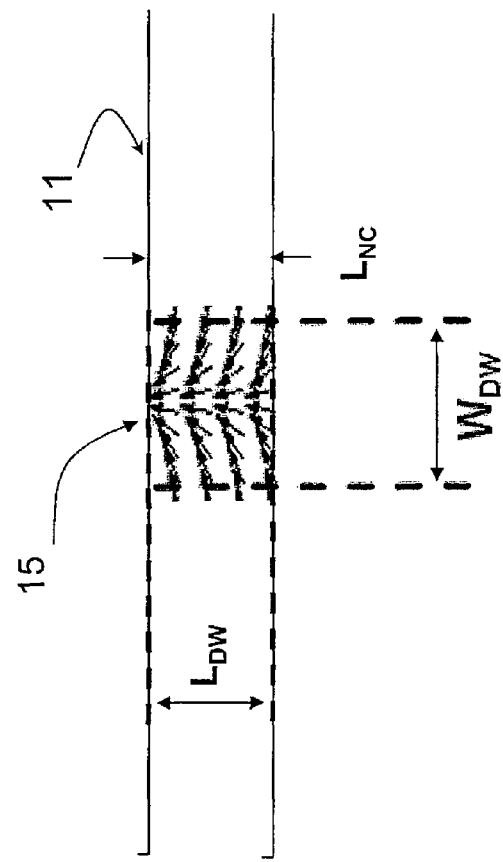
FIG. 1c shows a detail of a nanochannel 11.

FIG. 1c shows a detail of the nanochannel 11, from which there may be noted a thickness W$_{DW}$ of the domain wall 15, i.e., the dimension of the domain wall 15 in the direction of the axis x, as well as a length L$_{DW}$ of the domain wall 15, i.e., the dimension of the domain wall 15 perpendicular to the direction of the axis x and the direction of the measurement current. It is known that in a nanochannel, the length L$_{DW}$ of the domain wall 15 is in effect equal to a width L$_{NC}$ of the nanochannel 11. In this example, the size in the direction of the thickness of the film (perpendicular to the plane of FIG. 1c) is not taken into account, and it is clear that the variations in the cross section of the wall 15 follow substantially the variations in the width $L_{NC}$. It is, in fact, the width of the nanochannel 11 that determines the length $L_{DW}$ of the domain wall 15; if the nanochannel were wider, the domain wall would be longer—see P. Bruno Phys. Rev. Lett. 83, 12, pp. 2425-2428, (1999).

In addition to the effect described above due to electron scattering at the wall, i.e., to the resistance of the domain wall as such, there is an additional effect produced by the wall 15, referred to as "spin accumulation". Said phenomenon is known also in relation to spin-valve devices.

In a single homogeneous material, the ends of which are magnetized, for example, in opposite directions, as occurs in FIG. 1a with the pads 12 and 13, where the opposite directions of magnetization are indicated by the arrows 16 and 17, there is naturally formed a magnetic wall, namely, the wall 15, which presents a resistance to the motion of the electrons. The electrons that enter the pad 12 from the left are biased in the direction indicated by the arrow 16. When they encounter the wall 15, they are scattered because they enter an area magnetized in the opposite direction. This constitutes the contribution to the resistivity of the magnetic wall 15 due to electron scattering. Furthermore, the fact that in the proximity of the magnetic wall 15 the electrons biased in the pad 12 are forced to slow down on account of the resistance of the wall 15, determines an accumulation of charge in the proximity of the wall itself, which is referred to as "spin accumulation". The electrons that follow are then further slowed down by the accumulation of charge of the same sign. This is the contribution to the resistivity of the magnetic wall 15 due the phenomenon of spin accumulation. Said effect has been observed, for example, experimentally in cycles of magnetoresistive hysteresis in cobalt wires having a section of 35 nm, as illustrated in the paper published by U. Ebels et al. in Phys. Rev. Lett. 84, 5, pp. 983-986, (2000).

Figure 2:
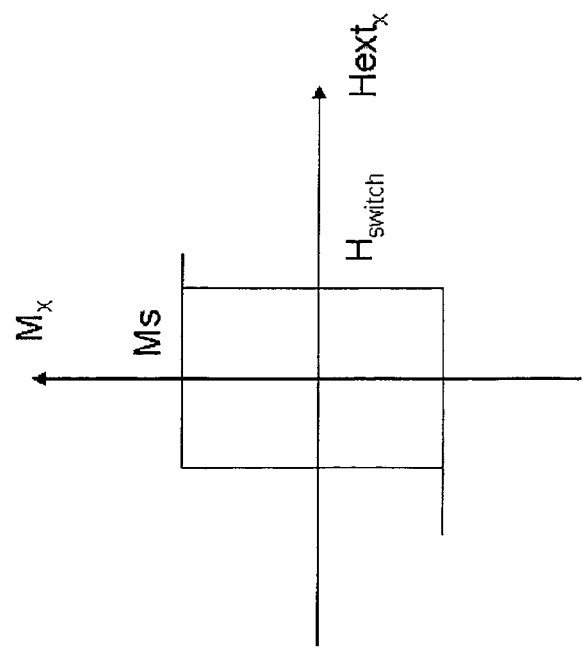
FIG. 2 schematically illustrates a magnetization Mx of a nanoconstriction 10.

The magnetization cycle of the device 10 of FIG. 1a is schematically illustrated in the diagram of FIG. 2, which shows a magnetization Mx of the nanoconstriction 10 along an axis x parallel to the direction of the nanochannel 11 of an external magnetic field $Hext_x$. $M_s$ indicates the value of saturation magnetization of the nanochannel 11, corresponding to the condition in which the magnetic moments, each corresponding to a single magnetic dipole, are all oriented in the direction of the external field. $H_{switch}$ indicates the value of switching field, i.e., the field necessary for reversing the magnetization of the nanochannel from one direction to the other (in the case of a nanochannel with constant cross section, see FIG. 1). The fact that the magnetization cycle of FIG. 2 corresponding to the device of FIG. 1a presents a steep slope around the switching field indicates that the nanochannel with constant cross section is remagnetized completely when the switching field is reached.

In order to provide a magnetic-field sensor with given properties, alongside the hysteresis cycle shown in FIG. 2, it is important to evaluate the magnetoresistance cycle, which describes how the conductivity of the device, and in particular of the nanochannel, which determines it to a large extent, varies as a function of the external magnetic field.

Figure 3:
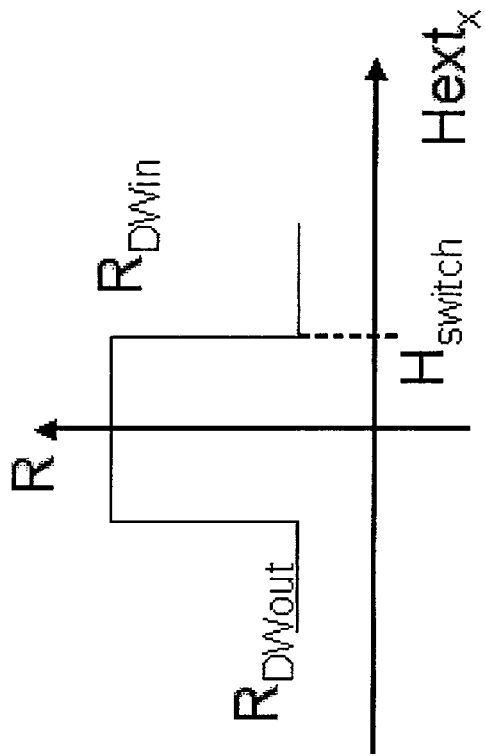
FIG. 3 is a diagram that gives the resistance of a nanoconstriction 10 as a function of the external magnetic field Hext$_x$.

In the diagram of FIG. 3, which gives the resistance of the nanoconstriction 10 as a function of the external magnetic field $Hext_x$, a value of resistance of the device $R_{DWin}$ is shown, corresponding to the condition in which the magnetic wall 15 is located within the nanochannel 11, as in FIG. 1a. The value $R_{DWout}$ corresponds, instead, to the resistance of the device when the magnetic wall 15 is located outside the nanochannel 11, as represented in FIG. 1b, where the wall is shown still within the nanochannel 11 but about to exit therefrom following upon a further increase in the external magnetic field $Hext_x$ in the same direction along the axis x.

Figure 4:
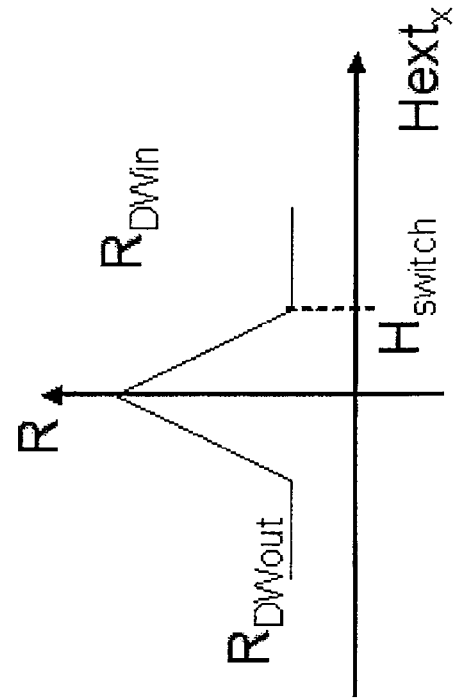
FIG. 4 shows a magnetoresistive characteristic with less sharp transitions between the values of resistance R$_{DWin}$ and R$_{DWout}$.

A device like the one described in relation to FIGS. 1a-1c, distinguished by the magnetoresistive characteristic shown in FIG. 3, is, however, far from suitable for use as magnetic-field sensor, in so far as it switches between the values of resistance $R_{DWin}$ and $R_{DWout}$; consequently, it is suited, rather, for operating as elementary storage device, in so far as it is bistable. In order to obtain a magnetic-field sensor that will enable measurement of the variation of intensity of a magnetic field in a continuous way, it is desirable to have available a magnetoresistive characteristic with less sharp transitions between the values of resistance $R_{DWin}$ and $R_{DWout}$, such as the one shown in FIG. 4.

The purpose of the present invention is to propose a solution able to provide a thin-film device for detecting physical quantities, in particular a magnetic-field sensor made using thin-film technology, suited to vary with continuity its own magnetoresistance as a function of an applied external magnetic field.

According to the present invention, the above purpose is achieved thanks to a device for detecting physical quantities, as well as a system of detection of magnetic field having the characteristics recalled specifically in the ensuing claims.

Figure 5A:
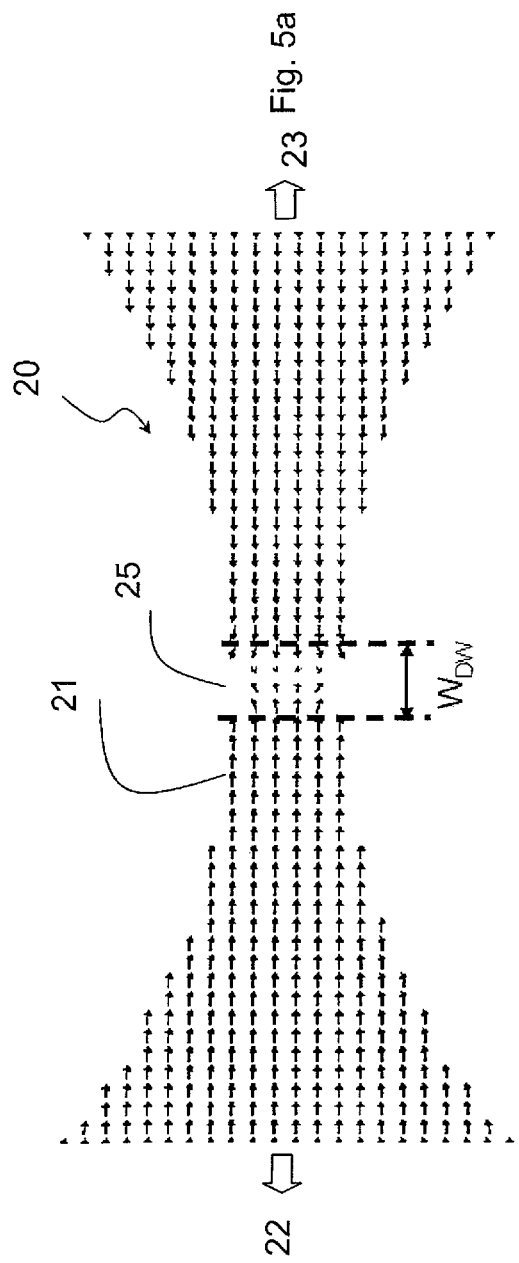
FIGS. 5a and 5b represent a working diagram of an embodiment of a magnetic-field sensor device according to the invention.
Figure 5B:
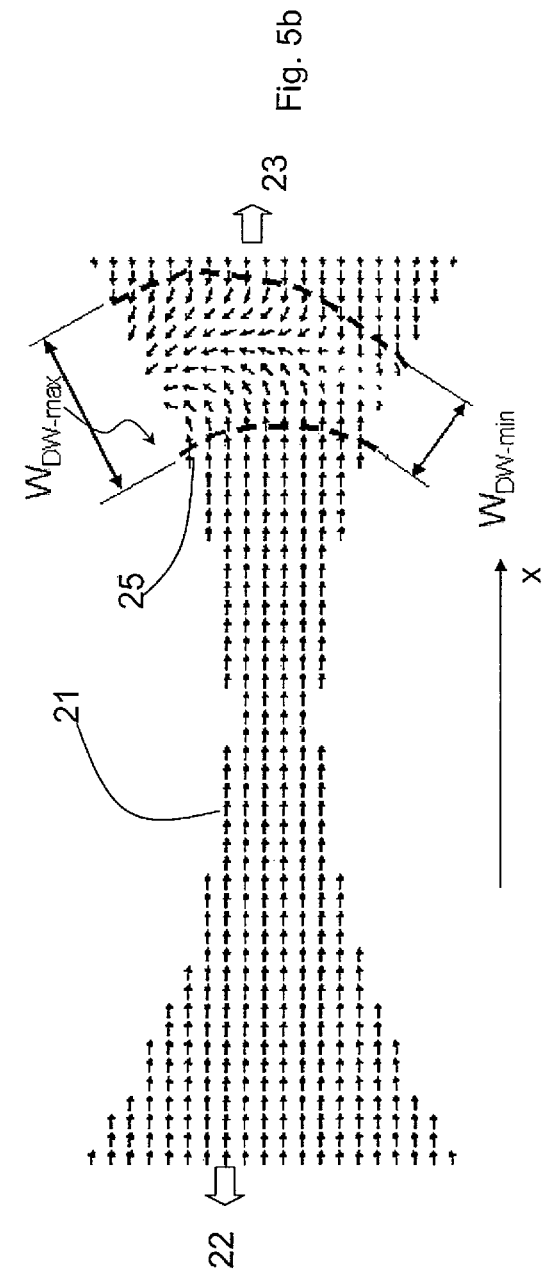
Figures 6A, 6B:
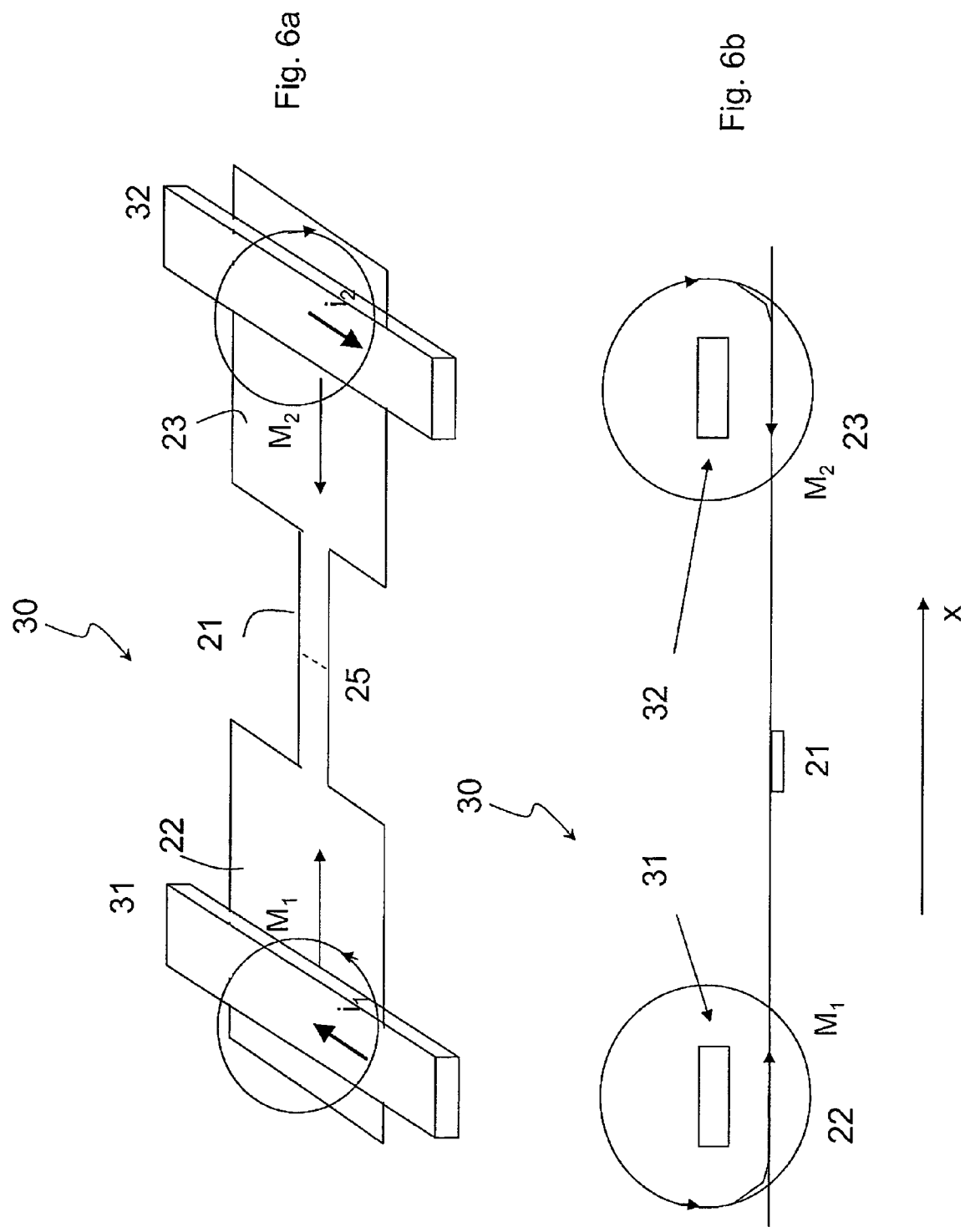
FIGS. 6a and 6b represent a working diagram of a variant of an embodiment of the magnetic-field sensor device according to the invention.
Figure 6C:
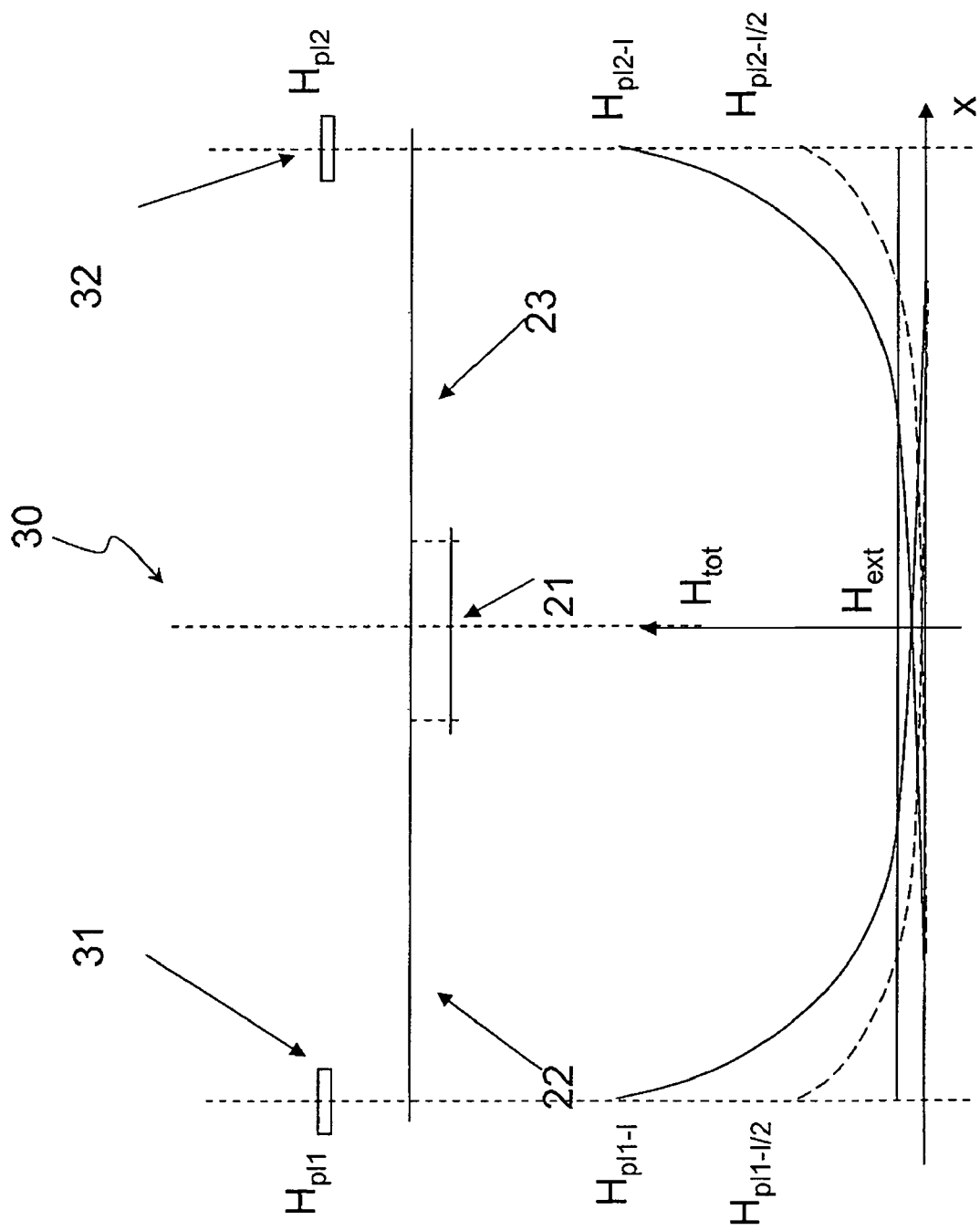
Figure 7A:
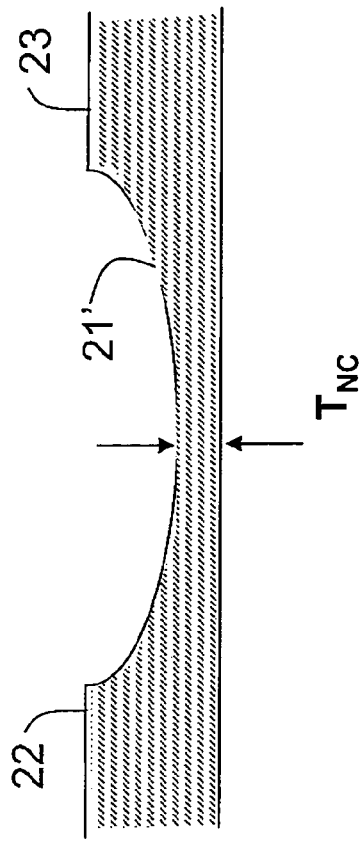
Figure 7B:
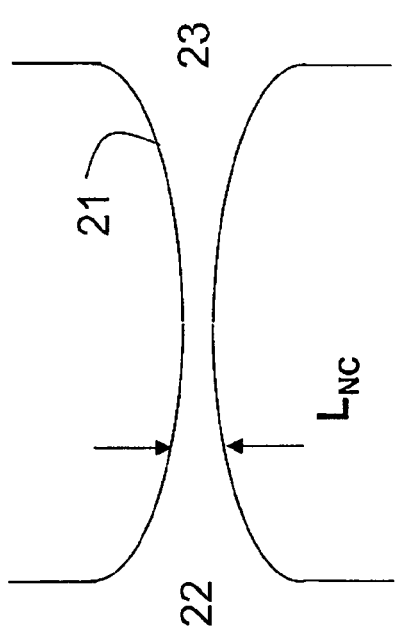
Figure 7C:
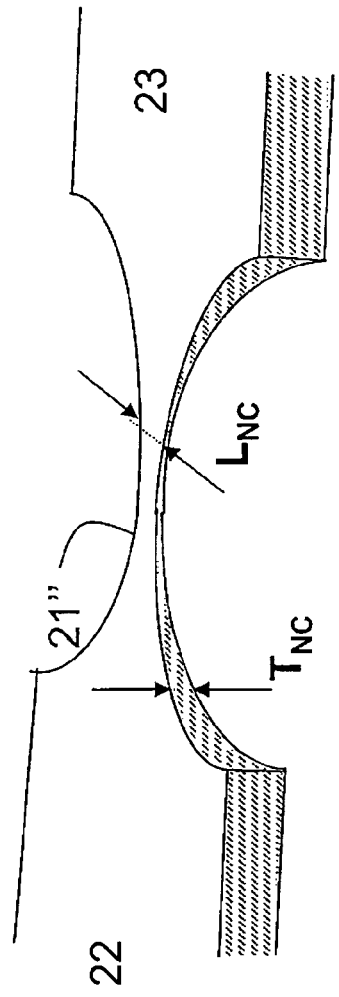

The invention will now be described with reference to the annexed plate of drawings, provided purely by way of non-limiting example, in which:

FIGS. 1a, 1b, 1c, 2, 3, 4 have already been described previously;

FIGS. 5a and 5b represent a working diagram of an embodiment of a magnetic-field sensor device according to the invention;

FIGS. 6a, 6b represent a working diagram of a variant of the embodiment of the magnetic-field sensor device according to the invention;

FIGS. 6c, 6d, 6e represent diagrams illustrating conditions of operation of the variant of the embodiment of the magnetic-field sensor device according to the invention;

FIGS. 7a, 7b, 7c represent three possible variants of the nanochannel used in the embodiment of FIG. 5a; and FIGS. 8a and 8b represent further variants of the nanochannel used in the embodiment of FIG. 5a.

The thin-film device for detecting physical quantities proposed is based substantially on the observation whereby it is the width of the nanochannel that determines the length of the domain wall; a wider nanochannel determines a longer domain wall. Consequently, the configuration of at least one cross section of the nanochannel in a nanoconstriction in such a way as to present variable amplitude as a function of different values of said physical quantity to be detected enables control of the curve of the resistance of the nanoconstriction in a different way from the case of a single sharp transition. In the case of the magnetic field, this displaces only the wall along the nanoconstriction with variable cross section, and thus deforms the wall on account of its displacement, whereas other quantities, such as, for example, a pressure, deform the nanochannel and in effect the wall, without necessarily displacing it.

The magnetic-field sensor device proposed hence substantially envisages obtaining a magnetoresistive curve that varies with continuity as a function of the external magnetic field by means of an appropriate shaping of the cross section of the nanochannel, which, with respect to known nanochannels, with constant cross section, is therefore rendered one with variable cross section in the direction of the length of the nanochannel.

The magnetic-field sensor device comprises, in particular, a nanochannel made of ferromagnetic material of any appropriately designed shape, with a length of between 30 nm and 1000 nm, a width of between 1 nm and 100 nm, and a thickness of between 1 nm and 100 nm, applying the micromagnetism model (Landau-Lifshitz-Gilbert equations) in order to position the wall within the nanochannel as a function of the external magnetic field within a range of preferably 0 to 5 Tesla. The magnetic domain wall must be able to position itself as a function of the external field in different points of the nanochannel corresponding to different surface cross sections.

As has been said previously, the device 10 described with reference to FIG. 1a has a magnetic behaviour such as the one represented in the diagram of FIG. 2. As may be evinced from the hysteresis cycle given in the figure, it is evident how the magnetization Mx passes instantaneously from a configuration in which the wall 15 is at one end of the nanochannel 11, or else at the centre of the nanochannel 11, to a configuration in which the wall 15 is at the other end of said nanochannel 11; i.e., the device switches in a very restricted neighbourhood of the switching field $H_{switch}$ (some hundreds of A/m). This macroscopic behaviour corresponds to a microscopic behaviour whereby the magnetic wall 15 is found to pass from one end to the other of the nanochannel 11 for very slight variations of the external field $Hext_x$ in the neighbourhood of the switching field $H_{switch}$.

The sensor device according to the invention enables, instead, displacement of the domain wall along the nanochannel for far wider variations of the external magnetic field (wide dynamic range), by appropriately designing, in terms of shape and dimensions, the device (in general, the shape and size of the nanochannel, as also the shape and size of the pads, all play a part, by magnetostatic interaction, in defining the characteristic ranges of the magnetization and magnetoresistive cycles, in terms of coercive, saturation, and remanence fields, and slope and shape of each segment of said cycles).

In this connection, FIG. 5a represents a nanoconstriction-structure device, designated as a whole by the reference number 20, which comprises a first ferromagnetic pad 22 and a second ferromagnetic pad 23 (only illustrated schematically in FIG. 5a), joined by a nanochannel 21 of variable cross section, the width $L_{NC}$ of which coincides with the length $L_{DW}$; i.e., it varies from a minimum value at the centre of the nanochannel 21 to a maximum value at the two ends of the nanochannel 21, where said nanochannel 21 gives out onto the first ferromagnetic pad 22 and onto the second ferromagnetic pad 23. Highlighted in the nanochannel 21 is the presence of a magnetic domain wall 15.

Since the profile of the nanochannel 21 is not linear, i.e., its section, or width $L_{NC}$ (which coincides with the length of the wall, $L_{DW}$), is variable, even though the position at the centre of the nanochannel 21 still corresponds to an energy minimum (condition of stability), under the stress of the external field $Hext_x$ a wall 25 can move away from the centre, migrating slowly, guided by the external field $Hext_x$ and then return to the centre of the nanochannel 21 itself as soon as the external field $Hext_x$ ceases.

Both electron scattering and spin accumulation produced by a magnetic wall depend upon the thickness of the wall itself, and, in particular, the electrical resistance produced by a wall is inversely dependent upon the thickness of the wall. The thickness $W_{DW}$ of a magnetic wall depends also upon its length $L_{DW}$, which corresponds to the thickness, or width, $L_{NC}$ of the nanochannel, as may be also seen with reference to FIG. 1c; consequently, a nanochannel of variable cross section, like the nanochannel 21, enables modification of the thickness $W_{DW}$ of the wall 25 by means of the external field $Hext_x$ as the wall 25 displaces along the nanochannel 21.

FIGS. 5a and 5b illustrate two respective different positions and the corresponding dimensions assumed by the magnetic wall 25 when the device 20 is subjected to external magnetic fields $Hext_x$ of different intensity, obtained through a micromagnetic simulation. Each small arrow in FIGS. 5a and 5b represents a uniform-magnetization cell with a square area of 9 nm² (3 nm×3 nm).

From FIG. 5a it is possible to desume of the dimensions of the geometries represented in FIGS. 5a and 5b for which the present applicant has conducted micromagnetic simulations, said simulations demonstrating the enlargement of the wall 25 on account of its displacement along the nanochannel with variable cross section produced by the external magnetic field.

FIG. 5a represents a condition of zero external magnetic field $Hext_x$ with a thickness $W_{DW}$=12 nm, whilst FIG. 5b represents a condition of external magnetic field $Hext_x$ oriented from left to right along the axis x with a thickness $W_{DW}$ that ranges between a minimum value $W_{DW-min}$ of 18 nm and a maximum value $W_{DW-max}$ of 33 nm, where $W_{DW-min}$ corresponds to a wall length of approximately 30 nm and $W_{DW-max}$ corresponds to a wall length of approximately 50 nm (in the case of the non-limiting geometry of the simulation shown). A wall with variable thickness may be represented by a infinite set of resistors with variable resistance set in parallel. If, for reasons of simplicity, the wall is divided into elementary walls of constant thickness, a resistor having a higher resistance corresponds to the element with smaller thickness, and vice versa. In the specific case of FIG. 5b, the elementary walls with lower resistance dominate in the parallel those with smaller thickness. Consequently, in the case represented, a wall positioned in an area further away from the centre of the nanochannel will correspond to a lower global resistance. A structure of this sort can be designed to obtain a magnetoresistance cycle having the form represented in FIG. 4.

Hence the magnetoresistance hysteresis cycle is also markedly dependent upon the geometrical shape of the nanochannel.

It should be noted that the geometry of the nanochannel with variable cross section can be defined also by varying the thickness of the nanochannel at constant width $L_{NC}$, in particular by depositing a variable-thickness film. Alternatively, it is possible to vary both of the dimensions that define the cross section of the nanochannel itself, namely, the width $L_{NC}$ and a thickness $T_{NC}$ thereof. FIG. 7a shows a plan view of the nanochannel 21, in which said width $L_{NC}$ varies, whereas the thickness $T_{NC}$, which corresponds to the thickness of the magnetic film, is not represented in FIG. 7a but is constant. Instead, FIG. 7b represents a cross-sectional view of a nanochannel 21' in which the thickness $T_{NC}$ varies while the width $L_{NC}$ (not represented) is kept constant. Clearly, the width $L_{NC}$ and the thickness $T_{NC}$ can also be varied simultaneously, as shown in the perspective view of FIG. 7c of a nanochannel 21", where both the width $L_{NC}$ and the thickness $T_{NC}$ are minimum at the centre of the nanochannel 21" and increase in the direction of the pads 22, 23.

In particular, it is also possible to carry out a three-dimensional modulation of the nanochannel, for example using devices of the current-perpendicular-to-plane (CPP) type obtained by electrodeposition. In this connection, FIG. 8a is a schematic illustration of a porous matrix 200 comprising conical pores 205. The conical pores 205 can be produced via non-collimated ion beams that work on a substrate 230. As shown in FIG. 8b, said porous matrix 200 can be inserted into an electrodeposition cell 210, comprising an anode 215 and a cathode 220, as well as an electrolyte 225 for depositing the desired ferromagnetic material in the pores 205 and hence obtaining nanochannels with variable cross section, in particular with conical cross section.

Not only the shape of the nanochannel 21, but also the materials of the nanochannel 21 and of the first ferromagnetic pad 22 and second ferromagnetic pad 23 can contribute to controlling the form of the hysteresis cycle so as to define the characteristic ranges of the magnetization and magnetoresistive cycle, the coercive, saturation, and remanence fields, and the slope and shape of each segment of said hysteresis cycles. By acting on said parameters, it is also possible to obtain forms of the hysteresis cycle that determine magnetoresistance curves that are linear, non-linear, or of arbitrary pattern.

In particular, the size of the first ferromagnetic pad 22 and of the second ferromagnetic pad 23 and the distance between them affect the mobility of the moments of magnetic dipole present in the nanochannel 21 and hence the characteristics of remagnetization of the nanochannel itself.

FIGS. 6a and 6b represent, respectively, a schematic view and a cross-sectional view of a variant 30 of the embodiment of magnetic sensor device 20, which comprises pinning lines 31 and 32, i.e., conductive paths set on top of the pads 22 and 23, in which respective pinning currents i1 and i2 are forced in a direction perpendicular to the direction x of the nanochannel 21. The perpendicular arrangement of the pinning currents i1 and i2 is preferred, even though it is clear to a person skilled in the sector that deviations from said condition of perpendicularity are acceptable, provided that there is a sufficient component of the current in the direction perpendicular to the axis x. In fact, around the currents i1 and i2 magnetic-field loops are generated, which induce pinning magnetizations $M_1$ and $M_2$ in the pads 22 and 23. The pinning lines 31 and 32 could also be set underneath the pads 22 and 23 and, possibly, underneath the substrate itself. The pinning lines 31 and 32 can be separated by a dielectric, in particular silicon oxide, alumina, silicon carbide, etc.

FIG. 6c shows a cross-sectional view substantially similar to that of FIG. 6b set alongside a diagram that gives the external field $Hext_x$ and the total magnetic field Htot in the device 30 as a function of the direction along the axis x. A case with low pinning current, i1=i2=I/2, is shown, which gives rise to magnetic fields with maximum values $H_{pI2=I/2}$ and $H_{pI1=I/2}$ at the ends, as well as a case of a higher pinning current i1=i2=I, which gives rise to magnetic fields with maximum values $H_{pI2=I}$ and $H_{pI1=I}$ at the ends.

Should the currents in the pinning lines 31 and 32 be low, e.g., in the case where i1=i2=I/2, the fields $H_{pi2=I/2}$ and $H_{pi1=I/2}$ produced thereby are also low. Since the magnetic fields produced by the pinning lines decay with the square of the distance, and assuming the external field uniform throughout the device 30, the total field Htot and the local field on each individual point of the nanocontact depend upon the current in the pinning lines 31 and 32. This means that for higher currents, e.g., in the case where i1=i2=I, more intense external fields are necessary to displace the wall 25 along the nanochannel 21. According to the currents in the pinning lines 31 and 32, and to the dimensions and shape of the nanochannel 21 and of the pads 22 and 23, it is possible to displace the switching field $H_{switch}$, which is thus a function of said parameters of shape and current of the device. In other words, it is possible to move the wall 25 along the nanochannel 21 gradually without this entailing variability in the electrical resistance of the device. These cases can be appreciated if reference is made to the diagram of FIG. 6e, which gives the resistance of the device 30 as a function of the external field $Hext_x$. When the wall 25 is at one of the two ends of the nanochannel 21, the resistance decays according to a curve of the type represented in FIG. 3.

The device 30 enables also solution of the problem of nucleation of the magnetic domain wall. In fact, the domain wall cannot exist initially or vanish during operation of the device. Both in the case of the device 10 of FIG. 1a and in the case of the device 20 of FIG. 5a, starting from a precise configuration of magnetization of the device, for example one in which the device is saturated in one direction or in the other, in the presence of a variable external field oriented in the direction opposite to that of magnetization of the device, it may happen that the magnetization will orient itself partially or totally in the direction of the field without any formation of a magnetic wall. Likewise, a wall that has formed may be lost because the external field saturates the device so that the device will no longer be able to detect magnetic fields.

To guarantee the presence of a magnetic wall in the device during operation, it is necessary to create it by a method of nucleation, i.e., to create the conditions of nucleation of a wall, which will subsequently assume a position of stability. The device 30 enables nucleation to be forced by means of the pinning lines 31 and 32. The passage of current in the pinning lines 31 and 32 generates a magnetic field, which magnetizes the corresponding ferromagnetic pad 22 or 23 in one way or in the other (if the current passes in the opposite direction). It is hence possible to magnetize the two pads 22 and 23 in antiferromagnetic configuration. In this configuration, there is forced nucleation of the magnetic wall 25, which will assume, in the absence of an external field, precisely a position of stability. If the structure is perfectly symmetrical, and the currents perfectly equal, the wall will position itself at the centre of the channel.

Since the film with which the nanochannel 21 is obtained is made of ferromagnetic material, its magnetic permeability is greater than zero; hence, the two pads 22 and 23 concentrate the lines of field within and parallel to the pads themselves. Since the lines of field are concentrated parallel in each pad, the pad 22 or the pad 23 is magnetized in a direction parallel to the plane. Since the two pinning lines 31 and 32, as shown in FIG. 6a, are traversed by currents i1 and i2 of opposite directions, the two pads 22 and 23 are in an antiparallel configuration of magnetization.

The sensitivity and dynamic range are a function of the current in the pinning lines 31 and 32 and of their shape so that it is possible to operate always in the same area of linearity, compensating for systematic measurement errors by changing the pinning currents i1 and i2 of the pinning lines 31 and 32. For example, if the magnetic-field sensor in question is used to constitute a positioning system, with the pinning currents i1 and i2 it is possible to render the system independent of the variations of the air gap, i.e., of the distance between the source of magnetic field and the device.

Magnetization by means of pinning currents affords an important advantage. In fact, the higher the currents, the higher the pinning fields. In the condition where the two currents are equal and opposite, the fields generated by the pinning lines block the magnetization of the pads with a magnetic force depending upon the field generated thereby. The wall formed is squeezed and compressed by the two magnetizations of the pads. If the magnetizations of the pads are in saturation, the maximum compression force on the magnetic wall is obtained; in fact, in addition to magnetizing the pads, the fields generated by the pinning lines are added to the fields produced by the magnetized pads. The field produced by the pinning lines and that induced by the magnetized pads both act on the wall itself, compressing it. A more compressed wall is, in fact, thinner and less free to move. When the wall is more constrained, higher external magnetic fields are necessary to move the wall itself, and this results in a wider dynamic range of measurement and a lower sensitivity. Corresponding to a thinner wall is a higher magnetization gradient; it is, in fact, possible that two consecutive magnetic dipole moments of form between them an angle of 90°; the wider the angle formed by said moments of dipole, the higher the external field required for displacing the wall.

According to one aspect of the invention, it is hence envisaged to control the dynamic range, the switching fields, and the slope of the magnetization curve as a function of the pinning currents.

This proves particularly advantageous in the case where the aim is to change the curve of response of the sensor during operation. This can be useful in different circumstances, such as, for example, in the case of variations in temperature of the place where the sensor is housed, which bring about a change in the characteristic of the sensor: by varying the pinning currents, it is hence possible to restore the curve to the optimal values. It can also be advantageous to accommodate variations in the air gap. In general, the magnetic sensor is used for detecting the presence of an external source of magnetic field. For example, in the case of application to a positioning system, in which the position of a mobile magnetic part moving in a direction parallel to the plane on which the nanochannel lies is measured, there may be displacements also in a direction orthogonal to the movement of the mobile part, which are caused, for example, by vibrations. If, for example, the distance between the source and the sensor increases, the field produced by the source in the nanochannel is inevitably smaller. In this case, it may be useful to render the sensor more sensitive by reducing the pinning currents. Following upon said adjustment, the wall becomes more mobile, and for lower fields it can present a lower resistance.

By means of the pinning currents i1 and i2, the pinning field, i.e., the pinning magnetizations $M_1$ and $M_2$, the shape and thickness of the wall and, consequently, the resistance of the domain wall 25, and the switching field $H_{switch}$ are changed. All the electrical and magnetic parameters of the device are controllable. The higher the currents, the lower the mobility of the wall in the nanochannel.

The current lines can have different shapes (they may even be planar, two-dimensional, coils or three-dimensional coils) and directions.

An application of the sensor according to the invention is possible in the form of nanomagnetostrictive bridge. The sensor, in fact, becomes a pressure sensor, a strain sensor, or else a torsion sensor if it is made of magnetostrictive material (nickel, terphenol or any material with a magnetostriction coefficient higher than 1). The dimensions of a nanochannel made of this material can be changed by means of a mechanical field of forces.

A nanochannel having the shape represented in FIG. 5a may possibly be used, even though, albeit in the limits of a sharp characteristic of detection, the application is valid also for linear nanochannels such as the one represented in FIG. 1a. If, for example, the nanochannel is subjected to a compressive stress (as in the case of a pressure sensor), in particular configurations it may undergo a consequent lengthening. A lengthening of the nanochannel can be produced also by a lengthening of the substrate (as in the case of a strain sensor) or by its torsion (as in the case of a torsion sensor). The substrate may consist also of elastic material (e.g., plastic) or simply flexible material.

The consequence of lengthening of the nanochannel and its thinning, with resulting thinning of the magnetic wall, which bring about variations in the characteristic of conductivity, according to the main characteristic of the invention, which envisages configuration of a cross section of said nanochannel so as to present variable amplitude as a function of different values of the physical quantity to be detected; in this case, said physical quantity is a force, which itself determines the variation of cross section, whereas, in the case of the magnetic-field sensor, the variation of cross section along the axis x is determined by the geometry imposed by design of the device.

It is to be noted that, in each elementary device, the ratio between the dimensions of the nanochannel and of the complete device constituted by the ensemble of the nanochannel, pads and wires, must be as high as possible in order not to bring about a marked reduction in the magnetoresistance ratio defined as relative difference between the resistance R(H) of the complete device in the presence of the external magnetic field and the resistance R(0) in the absence of an external field.

If we define as a ratio MRratio=(R(0)−R(H))/R(0), the numerator depends only upon the phenomena that involve the nanochannel.

The dimensions of the nanochannel are to be compared with the dimensions of the magnetic wall, which are the real cause of the DW magnetoresistance. The nanochannel must be as short as possible. Said parameter must be defined as a compromise between high values of the ratio MRratio (the shorter the nanochannel, the higher said ratio) and wide dynamic range (with a long nanochannel, the wall has more space for its deformation).

The device can be made according to at least two configurations:
  current in plane (CIP), where the nanochannel is planar; said configuration can be obtained by ion-milling, focused-ion-beam techniques, electron-beam lithography, deep photolithography, or x-ray lithography; and
  current perpendicular to plane (CPP); to do this it is necessary to have available porous matrices and processes for filling the pores to obtain vertical channels.

The latter can be obtained by means of electrodeposition of ferromagnetic metals, magnetic semiconductors, and rare earths in nanoporous matrices. Said matrices can be obtained via:
  polymeric track-etched templates, obtained by high-energy ion bombardment on materials such as polycarbonate or polyamide;
  anodized porous alumina;
  photoresists rendered nanoporous by ion-milling, focused-ion-beam techniques, electron-beam lithography, deep photolithography, and x-ray lithography; and
  nanoindentation obtained using an atomic-force microscope or scanning-tunnelling microscope.

The density of the pores can vary, with diameters of between 1 nm and 500 nm, and pore depth of between 30 nm and 1000 nm.

Deposition can be obtained by sputtering and CVD of the same materials in the same matrices as those mentioned above.

Once the nanochannel is obtained, it is coated with oxide, and the pinning lines are made on top by ion-milling, focused-ion-beam techniques, electron-beam lithography, deep photolithography, and classic photolithography.

For the initial packaging a cap layer such as SiC, alumina, silicon oxides or other refractory oxides may be used according to the application.

The solution just described enables considerable advantages to be achieved as compared to the known solutions.

The thin-film device for detecting physical quantities according to the invention is advantageously able to vary its own magnetoresistance with continuity as a function of an external applied magnetic field, in so far as the section of the magnetic wall also varies and modulates the magnetoresistance.

The joint use in association with the pinning lines advantageously enables the curve of response of the sensor to be changed during operation.

Of course, without prejudice to the principle of the invention, the details of construction and the embodiments may vary widely with respect to what is described and illustrated herein purely by way of example, without thereby departing from the scope of the present invention.

For example, the ferromagnetic pads may have associated thereto permanent magnetizations, for example, provided by a process of deposition in an orientation magnetic field. In particular, said pads in the form of permanent magnets can be obtained by a spring-magnet multilayer, i.e., substantially a bilayer constituted by a first layer with high coercivity and low saturation, and a second layer with high saturation and low coercivity coupled by means of layer-layer exchange interaction. The high-coercivity layer magnetizes the high-saturation layer and constrains the magnetization thereof even when the entire bilayer is subjected to opposite fields that are much more intense than the coercive field of the high-saturation layer. The result is a thin-film permanent magnet with high magnetic induction. The resultant hysteresis cycle has a high energy product between the coercive field of the bilayer and its remanence field. The definition "spring magnet" includes systems of antiferromagnetic layers (IrMn, FeMn, etc.) and high-remanence layers (FeCo, FeCoB, etc.), which are normally used in the art as hard layers in spin-valve devices. Also in this case, the layers are coupled to one another by layer-layer exchange interaction.

The invention claimed is:

1. A thin-film device for detecting the variation of intensity of physical quantities, in particular a magnetic field, in a continuous way, comprising an electrical circuit including one or more sensitive elements, said device being designed to vary its own electrical resistance as a function of the intensity of the physical quantity to be detected, said one or more sensitive elements comprising at least one nanoconstriction, said nanoconstriction comprising at least two pads made of magnetic material, associated to which are respective magnetizations oriented in directions substantially opposite to one another and connected through a nanochannel, said nanochannel being able to set up a domain wall that determines the electrical resistance of said nanoconstriction as a function of the dimensions of said domain wall formed in said sensor device, wherein at least one cross section of said nanochannel is configured so as to present an amplitude variable along one or more axes as a function of different values of said physical quantity to be detected, and wherein the device is capable of detecting the variation of intensity of physical quantities, in particular a magnetic field, in a continuous way.

2. The device for detection of physical quantities according to claim 1, wherein said nanochannel is configured by deposition with a cross section of variable extension.

3. The device according to claim 2, wherein said variable cross section assumes maximum values at the ends of the nanochannel and a minimum value in a point substantially intermediate between said ends of the nanochannel.

4. The device according to claim 3, wherein said pads are obtained via permanent magnetic materials.

5. The device according to claim 2, wherein said nanoconstriction comprises current lines that carry pinning currents, which comprise at least one component perpendicular to the axis of the nanochannel.

6. The device according to claim 5, wherein it is configured for modulating the intensity of the pinning currents to vary a value of switching field.

7. The device according to claim 5, wherein it is configured for forcing in said pinning lines currents designed to magnetize the pads of the nanoconstriction in an antiferromagnetic configuration to bring about nucleation of the domain wall.

8. The device according to claim 5, wherein it is configured for modulating the pinning currents to compensate for variations in temperature and/or variations in air gap.

9. The device according to claim 5, wherein it is configured for modulating the pinning currents for controlling the dynamic range of said sensor device and/or the switching fields and/or the slope of its magnetization curve.

10. The device according to claim 1, wherein it is configured for receiving in said pads a measurement current and in that associated to said pads are means for measurement of the voltage drop.

11. The device according to claim 1, wherein said first magnetic pad and said second magnetic pad and/or said nanochannel are configured geometrically for controlling further parameters of a hysteresis cycle, said parameters of the hysteresis cycle including the slope and/or the curvature and/or the coercitive field and/or the saturation field and/or the remanence field.

12. The device according to claim 1, wherein said first magnetic pad and/or said second magnetic pad are configured with values of dimension and/or distance between one another calculated as a function of a desired mobility of the magnetic dipole moments present in the nanochannel.

13. The device according to claim 1, wherein it is of the current-in-plane type and the nanochannel is planar.

14. The device according to claim 1, wherein said device is of the current-perpendicular-to-plane type and the nanochannel is vertical and obtained in a porous matrix, the pores of which have arbitrary shapes and dimensions.

15. The device according to claim 14, wherein said pores are conical pores, in particular produced with non-collimated ion beams to bring about a three-dimensional modulation of the nanochannel.

16. The device according to claim 1, wherein said nanochannel is configured with variable cross section via application of a force that constitutes the physical quantity to be measured.

17. The device according to claim 16, wherein the nanochannel is configured with a shape that can undergo lengthening following upon a compressive stress.

18. The device according to claim 16, wherein the nanochannel is configured to undergo lengthening and/or torsion by being associated with a deformable substrate, in particular an elastically deformable one.

19. The device according to claim 16, wherein said nanochannel is formed in magnetic material presenting magnetostrictive characteristics.

20. The device according to claim 16, wherein said nanoconstriction comprises current lines that carry pinning currents, comprising at least one component perpendicular to the axis of the nanochannel.

21. The device according to claim 1, wherein said pads of magnetic material are obtained via spring-magnet multilayer.

22. The device according to claim 1, further comprising current lines that carry pinning currents, wherein said current lines are positioned on top of and/or underneath said pads.

23. The device according to claim 1, further comprising current lines that carry pinning currents, wherein said current lines are separated by a dielectric, in particular silicon oxide.

24. The device for detection of physical quantities according to claim 1, wherein said variable amplitude determines the enlargement of said domain wall on account of its displacement along the nanochannel.

25. A method for detecting magnetic fields comprising:
using a thin-film magnetoresistive element in the form of nanoconstriction comprising at least two pads made of magnetic material;
associating to said pads respective magnetizations oriented in substantially opposite directions and a nanochannel, which connects said pads, in said nanochannel there being set up a domain wall, which determines the electrical resistance of said nanoconstriction as a function of the dimensions of said domain wall; and
measuring said electrical resistance as a function of an external magnetic field,
wherein said method comprises the operation of using a nanoconstriction having said nanochannel with cross section that is variable along the axis of the nanochannel.

26. The method according to claim 25, wherein said nanochannel with variable cross section has maximum values at the ends of the nanochannel and a minimum value in a substantially mid point of said nanochannel.

27. The method according to claim 25, providing, in association with said nanoconstriction current lines, which carry pinning currents having at least one component perpendicular to the axis of the nanochannel.

28. The method according to claim 27, wherein it comprises modulating the pinning currents during operation in order to compensate for variations in temperature and/or variations of air gap.

29. The method according to claim 27, wherein it comprises modulating the pinning currents for controlling the dynamic range of the sensor and/or the switching fields and/or the slope of the magnetization curve.

30. The method according to claim 28, wherein modulating the pinning currents during the operation to compensate for variations of temperature and/or variations of air gap comprises varying the value of the pinning currents in order to vary the sensitivity in a positioning system.

31. The method according to claim 25, providing said pads using permanent magnetic materials.

32. The method according to claim 25, forcing in said nanoconstriction a measurement current and measuring the voltage drop across said nanoconstriction.

33. The method according to claim 25, further controlling parameters of the hysteresis cycle through geometrical parameters and/or parameters corresponding to the material of the first ferromagnetic pad and of the second ferromagnetic pad, said parameters of the hysteresis cycle including the slope and/or curvature and/or coercive field and/or saturation field and/or remanence field.

34. The method according to claim 25, varying the dimensions of the first ferromagnetic pad and/or of the second ferromagnetic pad and/or a respective distance between them in order to vary the mobility of the moments of magnetic dipole present in the nanochannel.

35. The method according to claim 25, forcing respective pinning currents in pinning lines to generate loops of magnetic field that induce respective magnetizations in the pads of the nanoconstriction.

36. The method according to claim 25, modulating the intensity of pinning currents in order to vary a value of switching field.

37. The method according to claim 25, wherein it comprises a procedure of nucleation of the domain wall, which comprises forcing in pinning lines currents designed to magnetize the pads of the nanoconstriction in an antiferromagnetic configuration.

38. A sensor device for detecting magnetic fields, of the type comprising a magnetoresistive element in the form of nanoconstriction, said nanoconstriction comprising at least two pads made of ferromagnetic material, associated to which are respective magnetizations oriented in directions substantially opposite to one another and connected through a nanochannel, said nanochannel being able to set up a domain wall that determines an electrical resistance of said nanoconstriction as a function of the dimensions of said domain wall formed in said sensor device, said sensor device being wherein said nanochannel has a variable cross section along an axis of the nanochannel.

39. A force-sensing device comprising a magnetoresistive element in the form of nanoconstriction, said nanoconstriction comprising at least two pads made of magnetic material, associated to which are respective magnetizations oriented in directions substantially opposite to one another and connected through a nanochannel, said nanochannel being able to set up a domain wall that determines an electrical resistance of said nanoconstriction as a function of the dimensions of said domain wall formed in said sensor device, said nanochannel being configured for varying a cross section thereof along an axis of the nanochannel following upon application of a force.

* * * * *